(12) United States Patent
Sakurai et al.

(10) Patent No.: US 11,043,434 B2
(45) Date of Patent: Jun. 22, 2021

(54) METHOD OF MANUFACTURING A SEMICONDUCTOR DEVICE

(71) Applicant: ABLIC Inc., Chiba (JP)

(72) Inventors: Hitomi Sakurai, Chiba (JP); Masaru Akino, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/743,959

(22) Filed: Jan. 15, 2020

(65) Prior Publication Data
US 2020/0152529 A1 May 14, 2020

Related U.S. Application Data

(62) Division of application No. 15/896,356, filed on Feb. 14, 2018, now Pat. No. 10,580,708.

(30) Foreign Application Priority Data

Feb. 17, 2017 (JP) .................................. 2017-028013
Dec. 20, 2017 (JP) .................................. 2017-243998

(51) Int. Cl.
| | |
|---|---|
| *H01L 21/66* | (2006.01) |
| *H01L 21/28* | (2006.01) |
| *G01R 31/26* | (2020.01) |
| *H01L 29/78* | (2006.01) |
| *G01R 31/18* | (2006.01) |
| *H01L 29/94* | (2006.01) |
| *G01R 31/28* | (2006.01) |

(52) U.S. Cl.
CPC .............. *H01L 22/20* (2013.01); *G01R 31/18* (2013.01); *G01R 31/2621* (2013.01); *H01L 21/28017* (2013.01); *H01L 22/14* (2013.01); *H01L 29/78* (2013.01); *H01L 29/94* (2013.01); *G01R 31/2831* (2013.01); *H01L 21/28202* (2013.01); *H01L 21/28211* (2013.01)

(58) Field of Classification Search
None
See application file for complete search history.

(56) References Cited

U.S. PATENT DOCUMENTS

| | | |
|---|---|---|
| 5,298,433 A | 3/1994 | Furuyama |
| 7,106,084 B2 | 9/2006 | Fukaya |
| 2018/0240721 A1 | 8/2018 | Sakurai et al. |
| 2020/0152529 A1* | 5/2020 | Sakurai ................... H01L 29/94 |

FOREIGN PATENT DOCUMENTS

JP          H05-74898 A         3/1993

* cited by examiner

*Primary Examiner* — Jack S Chen
(74) *Attorney, Agent, or Firm* — Brinks Gilson & Lione

(57) ABSTRACT

In a manufacturing step in which a structure of target of screening is formed on a semiconductor substrate in the middle of manufacturing process before a semiconductor device is finished, screening of potential defects of a gate insulating film is performed for each wafer at one time so that the semiconductor device is caused to appear as an initial defective product when the finished semiconductor device is subjected to an electrical characteristic test. Provided are a semiconductor device, and a method of manufacturing a semiconductor device which enables reliable screening of potential defects in a short period of time.

4 Claims, 6 Drawing Sheets

METHOD OF MANUFACTURING A SEMICONDUCTOR DEVICE

RELATED APPLICATIONS

This application is a divisional patent application of U.S. application Ser. No. 15/896,356, filed Feb. 14, 2018, which claims priority under 35 U.S.C. § 119 to Japanese Patent Application Nos. 2017-028013 filed on Feb. 17, 2017 and 2017-243998 filed on Dec. 20, 2017, the entire content of which are hereby incorporated by reference.

BACKGROUND OF THE INVENTION

1. Field of the Invention

The present invention relates to a method of manufacturing a semiconductor device, and more particularly, to a method of manufacturing a semiconductor device including a screening step under a state of a wafer and a semiconductor device.

2. Description of the Related Art

In some cases, a step of screening defective products is introduced in a function verification test for semiconductor devices including MIS transistors and MIS capacitor elements, for example, semiconductor integrated circuits, after at least the semiconductor devices are finished on semiconductor substrates in order to sort and remove semiconductor devices including an initial defect and a potential defect due to a defect in a gate insulating film.

For example, a semiconductor device including an MIS transistor and a capacitor element having a gate insulating film as a dielectric body, which are formed on a semiconductor substrate processed into a wafer having a thin disc-shape, is formed by a known technology, and is brought into a state in which the resultant semiconductor device at least functions as a desired semiconductor device.

Subsequently, under a state of the wafer having formed thereon a plurality of semiconductor devices or after being processed into individual semiconductor devices, the semiconductor device is subjected to an electrical characteristic test to verify whether the semiconductor device achieves desired functions, and is sorted as a non-defective product or a defective product. One of the items included in the electrical characteristic test is the above-mentioned screening of initial defects and potential defects due to a defect in a gate insulating film.

At this time, an MIS transistor and an MIS capacitor element in which the insulating property of the gate insulating film is impaired due to an apparent defect at the time when the semiconductor device is finished cannot achieve the desired function of the element due to a high leakage current of the element including the defect. It is therefore possible to cause such defects of the MIS transistor and the MIS capacitor element to appear as initial defects to screen the semiconductor device in an electrical characteristic function test of the semiconductor device.

Meanwhile, the semiconductor device is determined as non-defective in the above-mentioned temporary electrical characteristic function test if the insulating property of the gate insulating film is scarcely maintained at the time when the semiconductor device is finished and defect of the MIS transistor or the MIS capacitor element does not appear as initial defects, even though the semiconductor device includes an MIS transistor and an MIS capacitor element that include, for example, a crystal defect in the semiconductor substrate, a local thinning of the insulating film due to a defect in a step before or after the gate insulating film forming step, or a contaminated portion in the insulating film. However, the semiconductor device does not have an essentially required quality, for example, an insulating film ensuring a required insulation withstand voltage and a required lifetime, and hence it is highly likely that the semiconductor device includes a potential defect that is to appear in an actual use after shipment of the product.

In order to also screen such a semiconductor device including a potential defect before shipment, a burn-in test in which a load larger than that applied during an actual operation is applied to accelerate a time period required by the semiconductor device to result in a failure is performed, for example, under a high temperature and under a relatively high power supply voltage, for a certain time period to destruct the low-quality gate insulating film, to thereby show the semiconductor device is defective and worth removing (see, for example, Japanese Patent Application Laid-open No. H 05-74898).

However, the method of manufacturing a semiconductor device described in Japanese Patent Application Laid-open No. H 05-74898 has the following drawbacks.

(1) The screening is performed for each of the individual semiconductor devices after the wafer process, and hence the time required for the electrical characteristic test for the semiconductor device increases.

(2) An applicable voltage decreases due to the limitation on the breakdown voltage, for example, junction breakdown voltage between a source and a drain, of the MIS transistor included in the finished semiconductor device, and hence application of a long period of time is required due to insufficient electric field acceleration during screening, or the potential defect is not evoked due to insufficient screening.

(3) When a lot of defects are detected through the screening, it is concerned that those defects are not just point defects but are due to deterioration or an abnormality of the quality of the gate insulating film itself due to defects in the manufacturing steps. However, the removed defective products are finished semiconductor devices, and hence a failure cost is increased. In addition, defects appear in finished products, and hence defects in the manufacturing steps are noticed with some delay. As a result, it may be continued to manufacture defective products during that period.

SUMMARY OF THE INVENTION

In view of the foregoing, it is an object of the present invention to provide a method of manufacturing a semiconductor device for reliably screening potential defects on the entire wafer in a short period of time and at one time and decreasing a manufacturing failure cost of the semiconductor device.

In order to achieve the above-mentioned object and to screen potential defects on the entire wafer at one time, according to one embodiment of the present invention, the following measure is taken.

There is provided a method of manufacturing a semiconductor device, the semiconductor device including a gate insulating film and a gate electrode film on a semiconductor substrate of a wafer, the method including:

forming the gate insulating film on the semiconductor substrate of the wafer;

forming the gate electrode film on an entire surface of the semiconductor substrate of the wafer which includes the gate insulating film;

screening, after the forming the gate electrode film, the gate insulating film by generating a potential difference between the gate electrode film which is formed on the entire surface of the semiconductor substrate of the wafer, and a back surface of the semiconductor substrate of the wafer to apply an electric field to the gate insulating film;

determining the semiconductor substrate of the wafer which has been subjected to the screening; and patterning the gate electrode film after the determining the semiconductor substrate of the wafer.

Further, there is provided a semiconductor device which is manufactured by the above-mentioned manufacturing method.

With use of the above-mentioned measure, the following effects are obtained.

(1) Screening is performed for each wafer, and hence an effective screening test time for each chip is short.

(2) Only a structure for target of screening is formed on the wafer, and hence screening can be performed under a condition of sufficient electric field acceleration. As a result, a screening voltage is not required to be applied more than necessary for a long period of time. Consequently, it is possible to reliably cause the potential defects to appear to remove the semiconductor device as an initial defective product during the electrical characteristic test of the finished semiconductor device.

(3) A result of the screening is obtained in the middle of the manufacturing steps of the semiconductor device, and when there is not a point failure but, for example, an abnormality of quality of the gate insulating film, an abnormality in the manufacturing steps is noticed earlier, which leads to a quick improvement action.

DETAILED DESCRIPTION OF THE EMBODIMENTS

Now, preferred embodiments of the present invention are described with reference to the accompanying drawings.

Figure 1:
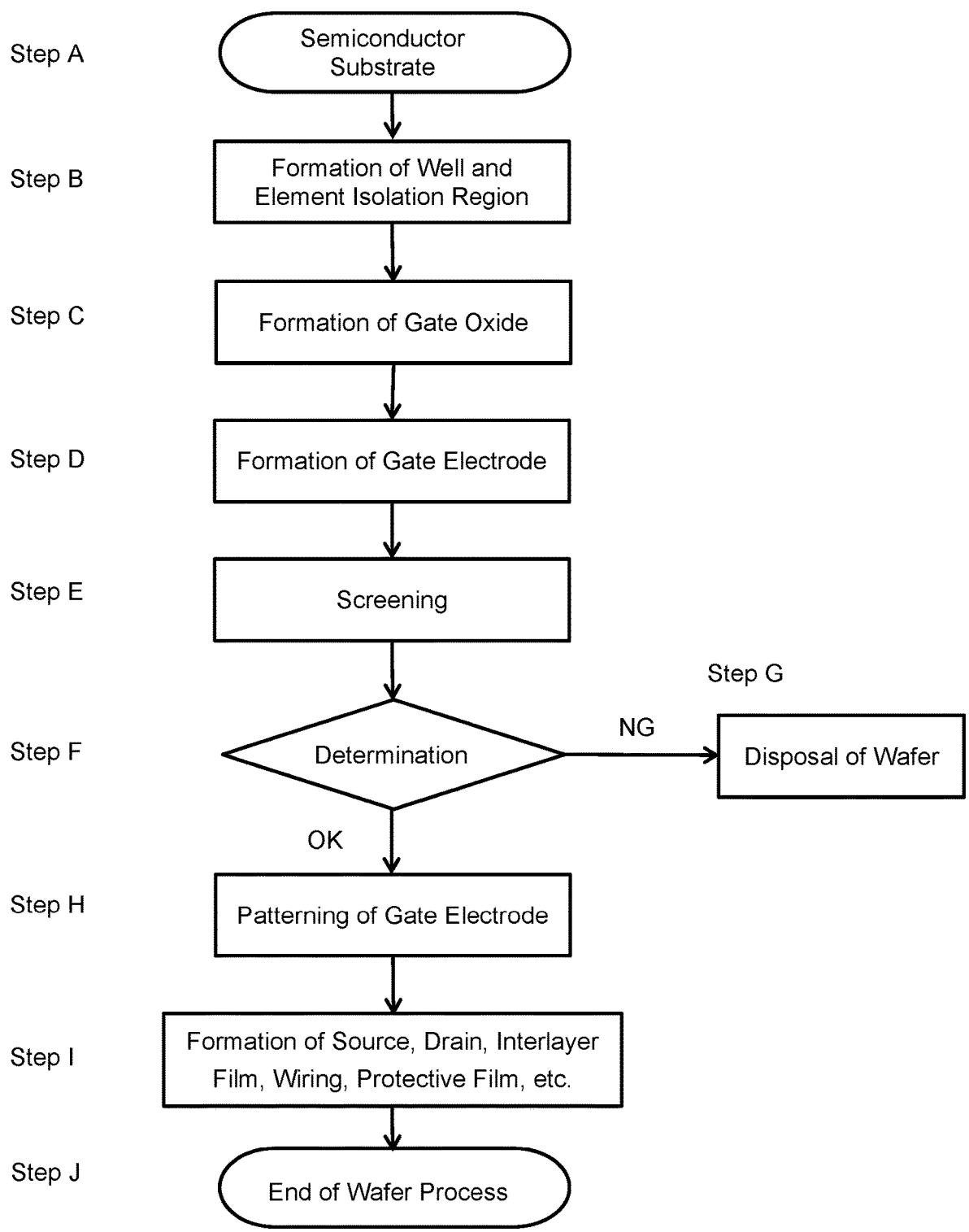
FIG. 1 is a process flow chart for illustrating a method of manufacturing a semiconductor device according to a first embodiment of the present invention.

FIG. 1 is a process flow chart for illustrating a method of manufacturing a semiconductor device according to a first embodiment of the present invention. Prior to forming on a semiconductor substrate an MIS transistor and an MIS capacitor element that are elements of the semiconductor device, a required structure of the semiconductor device is formed by a known technology before formation of a gate insulating film that is included in the MIS transistor and the MIS capacitor element.

For example, when a semiconductor device including an N-channel-type MIS transistor is manufactured, first, a P-type semiconductor substrate 1 is prepared. In general, a semiconductor substrate made of silicon that is processed into a wafer having a thin disc-shape is often used (Step A).

When required for setting a threshold value of the MIS transistor to a desired value, the following is performed on the prepared P-type semiconductor substrate. Specifically, a P-type well region having a concentration higher than that of the substrate is formed through impurity implantation and a diffusion step, a diffusion layer having a desired polarity and a desired impurity concentration is formed as a front surface of the semiconductor substrate, which serves as a lower electrode of the MIS capacitor element, by a known technology, and further element isolation regions 2 between the MIS transistor and the MIS capacitor element are formed by a technology of, for example, LOCOS or STI (Step B).

Next, a gate insulating film 3 included in the MIS transistor and the MIS capacitor element is formed on the entire surface of the semiconductor substrate by a known technology. The gate insulating film may be, regardless of a single-layer film or a multi-layer film, any film, for example, a silicon oxide film formed through thermal oxidation or deposition, a silicon nitride film, a silicon oxynitride film, or other films having an insulating property, as long as the film functions as the gate insulating film. Its film thickness is also not required to be limited as long as the thickness satisfies the specification of the MIS transistor and the MIS capacitor element. Further, at this time, cleaning before the formation of the gate insulating film is performed as necessary, for example (Step C).

In this gate insulating film forming step, when, for example, a crystal originated particle (COP) defect or a foreign matter is present on the front surface of the semiconductor substrate, which serves as a base layer, the formation of the gate insulating film is hindered at the place of the COP defect or the adhesion of the foreign matter, and thus a film that is locally thinner than the desired thickness of the gate insulating film and causes a potential defect is formed.

Next, on the gate insulating film 3, a gate electrode film 4 is formed on the entire surface of the semiconductor substrate by a known technology. The gate electrode film may be, regardless of a single-layer film or a multi-layer film, any film, for example, a film made of polycrystalline silicon containing impurities, a film obtained by forming a high-melting-point metal film on the film made of polycrystalline silicon, or other metal films, as long as the film functions as the gate electrode film. Its film thickness is also not required to be limited as long as the thickness satisfies the desired specification of the semiconductor device (Step D).

In this gate electrode film forming step, when, for example, a foreign matter is present on a surface of the gate insulating film, which serves as a base layer, or in the vicinity of an interface between the gate insulating film and the gate electrode film, deterioration of the quality of the gate insulating film that causes a potential defect is caused by contamination from the foreign matter. Further, local thinning of the gate insulating film may occur due to physical stress applied from the foreign matter to the gate insulating film in the manufacturing steps from the formation of the gate electrode film and the subsequent steps.

Subsequently, screening of the gate insulating film 3 is performed before patterning of the gate electrode film 4. The screening is performed by using as electrodes the back surface of the semiconductor substrate of a wafer and the gate electrode film formed on the entire front surface of the semiconductor substrate, and applying voltage to the gate insulating film sandwiched by both the electrodes. At this time, it is desired that the gate electrode film at an end portion of the front surface of the wafer have been removed or an insulating film equivalent to the element isolation regions have been formed from the front surface to the side surface and the back surface of the wafer end portion so that the gate electrode film formed on the entire front surface of the wafer being the semiconductor substrate is not short-circuited with the semiconductor substrate by, for example, extending to the back surface at the wafer end portion (Step E).

Figure 4A:
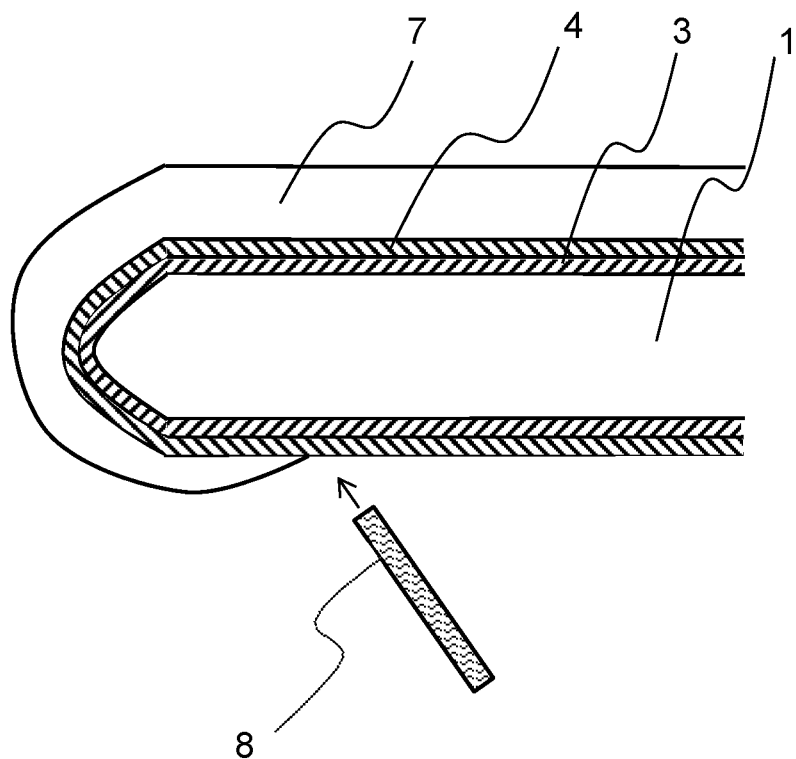
FIG. 4A and FIG. 4B are views for illustrating removal of a gate electrode film at an end portion of a semiconductor substrate and on a back surface of the semiconductor substrate in the first and second embodiments of the present invention.

Now, removal of the gate electrode film at the wafer end portion in the first and second embodiments of the present invention is described with reference to FIG. 4A and FIG. 4B. As illustrated in FIG. 4A, the semiconductor substrate 1, which has the gate insulating film 3 and the gate electrode film 4 that are laminated on the front surface and the back surface thereof, is arranged so that its back surface faces upward, and nitrogen gas is blown to the vicinity of the front surface of the semiconductor substrate 1 from a nitrogen outlet nozzle 8 while the semiconductor substrate 1 is rotated at from 50 rpm to 500 rpm. Then, mixed liquid of hydrofluoric acid and nitric acid, which serves as etchant 7 for the gate electrode film 4 made of polysilicon, is dropped on the back surface of the semiconductor substrate 1. The mixed liquid spreads on the entire back surface of the semiconductor substrate 1 to extend to the peripheral portion of the front surface. In this case, the amount of extension is determined based on the number of rotations of the semiconductor substrate 1 and the blow position and the blow amount of the nitrogen gas. When the gate electrode film on the back surface of the semiconductor substrate 1 and the gate electrode film in the peripheral portion of the front surface are removed, supply of the etchant is stopped, and the semiconductor substrate 1 is cleaned with pure water.

Next, hydrofluoric acid or BOE (buffered hydrofluoric acid), which serves as the etchant 7 for the gate insulating film 3 being an oxide film, is dropped on the back surface of the semiconductor substrate 1. The hydrofluoric acid or the BOE spreads on the entire back surface of the semiconductor substrate 1 to extend to the peripheral portion of the front surface.

When the gate insulating films on the back surface of the substrate and in the peripheral portion of the front surface are removed, supply of the etchant is stopped, and the semiconductor substrate 1 is cleaned with pure water and then dried. In this manner, the semiconductor substrate 1, which is illustrated in FIG. 4B and in which the gate electrode film and the gate insulating film are removed from the end portion of the front surface and the back surface of the semiconductor substrate 1, is obtained. As illustrated in FIG. 4B, a gate insulating film removal width S2 from an end surface of the semiconductor substrate 1 to an end surface of the gate insulating film 3 is set to be smaller than a gate electrode film removal width S1 from the end surface of the semiconductor substrate 1 to an end surface of the gate electrode film 4. With this configuration, occurrence of defects in the subsequent steps can be suppressed.

When the gate insulating film removal width S2 is larger than the gate electrode film removal width S1, the gate electrode film 4 overhangs, and when this gate electrode film 4 is patterned, the gate electrode film 4 peels off at its end surface, and this becomes a defect that causes decrease in yield. When the gate insulating film removal width S2 is set to be smaller than the gate electrode film removal width S1 as described above, decrease in yield can be suppressed.

Figure 2:
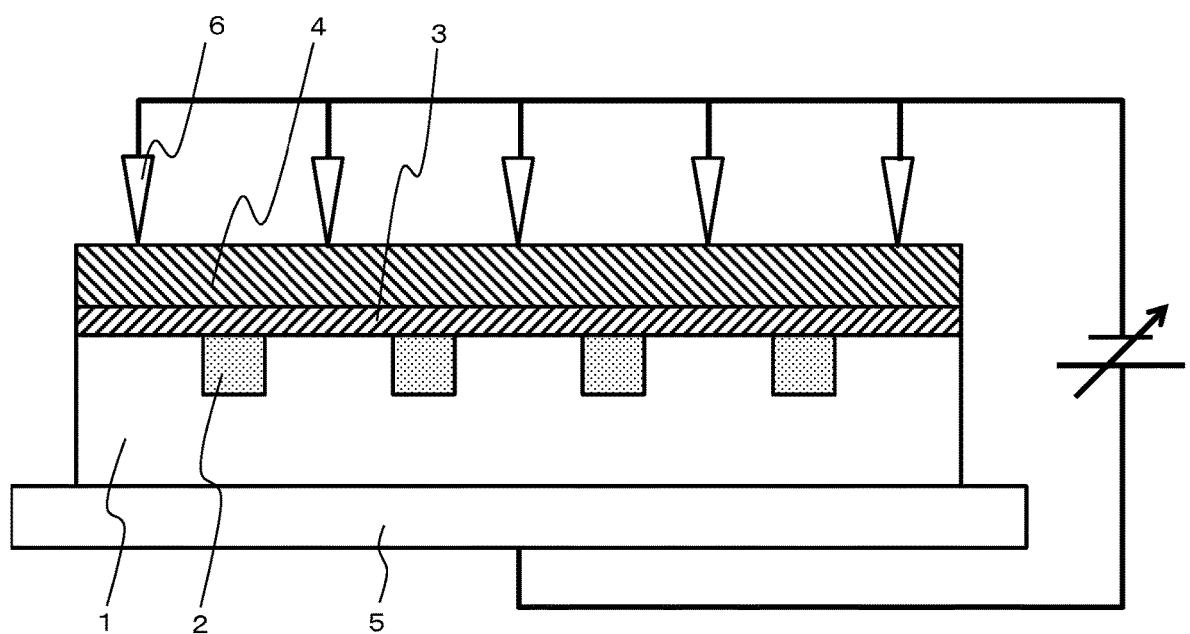
FIG. 2 is a sectional view for illustrating the method of manufacturing a semiconductor device according to the first embodiment of the present invention.

Further, with reference to FIG. 2, description is given of a method of obtaining a voltage application terminal to the semiconductor substrate 1 during the screening in the first embodiment of the present invention. The back surface of the semiconductor substrate 1 is fixed to a metal chuck 5 which serves as one voltage application terminal. Then, also from a front surface of the semiconductor substrate 1, a probe 6, namely, a metal terminal having a needle shape which is connected with the semiconductor device is brought into contact with the gate electrode film 4. The probe 6 can thus be used as the other voltage application terminal. The element isolation region 2 is formed in the vicinity of the front surface of the semiconductor substrate 1, and the gate insulating film 3 is formed between the gate electrode film 4 and the front surfaces of the semiconductor substrate 1 and the element isolation region 2.

At this time, in order to eliminate parasitic resistance causing decrease in applied voltage as much as possible, it is desired that insulating materials and high-resistance conductive materials that adhere to or are formed on the back surface of the semiconductor substrate 1, which is brought into contact with the metal chuck 5 of the prober, is removed in advance. Further, voltage application is possible when there is at least one probe 6 that is grounded on the gate electrode film 4, but in order to eliminate the effect of the parasitic resistance, it is desired that a plurality of probes that are uniformly grounded on the gate electrode film 4 formed on the entire front surface of the semiconductor substrate 1 be provided at a density of, for example, from 0.1 probes/cm$^2$ to 20 probes/cm$^2$.

Further, there is a possibility of damaging the gate electrode film 4 because the probe is directly grounded on the surface of the gate electrode film 4. However, as described later, a gate electrode is formed by patterning the gate electrode film after the screening, and hence, when the position of the probe is set in advance to portions of the gate electrode film 4 that are removed by the patterning, the effect of the damage on the finished product of the semiconductor device can be prevented.

With regard to the polarity of the applied voltage, for example, in a case of the above-mentioned N-channel-type MIS transistor and an MIS capacitor element including a P-type lower electrode, a screening effect can be obtained even when the P-type semiconductor substrate is applied with a ground voltage, and the gate electrode film is applied with a positive voltage with respect to the ground voltage. However, the front surface of the semiconductor substrate right below the gate electrode film becomes the depletion side, and when the concentration of the front surface of the semiconductor substrate is low, a depletion layer is liable to generate, and thus screening efficiency is lowered. When the P-type semiconductor substrate is applied with the ground voltage and the gate electrode film is applied with a negative voltage with respect to the ground voltage, the front surface of the semiconductor substrate right below the gate electrode film becomes the side of accumulation. As a result, voltage can be more effectively applied to the gate insulating film, which is preferred.

In the first embodiment, description is given of a case in which the polarity of the gate electrode film 4 is specified while the semiconductor substrate 1 is applied with the ground voltage. However, as the essence of the present invention, it is only required to maintain the relationship of the potential between the semiconductor substrate 1 and the gate electrode film 4. The same effect can be obtained even when the applied voltages are replaced, that is, when the gate electrode film 4 is applied with the ground voltage and the semiconductor substrate 1 is applied with a positive or negative voltage with respect to the ground voltage.

Breakdown modes of the gate insulating film include: an A mode, in which the gate insulating film is damaged at a low electric field of from 0 MV/cm to 3 MV/cm with respect to the thickness of the gate insulating film to become an initial defect; a B mode, in which the gate insulating film is damaged at a medium electric field of from 3 MV/cm to 8 MV/cm with respect to the thickness of the gate insulating film, and may become a potential defect; and a C mode, in which the gate insulating film is damaged at a high electric field of 8 MV/cm or more with respect to the thickness of the gate insulating film due to an intrinsic insulation withstand voltage limit of the insulating film. The gate insulating film loses its insulating property due to the breakdown, and does not perform its function anymore.

The above-mentioned local thinning of the gate insulating film that may become a possible potential defect has a film thickness of from 0% to 80% of the desired film thickness at, for example, the place of the COP defect or the vicinity of the foreign matter, and hence a breakdown electric field of the thin portion of the film reaches the intrinsic insulation withstand voltage limit while the breakdown electric field is of from 0% to 80% of that of a portion having a normal film thickness. As a result, the breakdown mode of the gate insulating film including such a defect is the A mode or the B mode.

Consequently, in order to screen portions of potential defects, it is only required to apply a voltage with which the thin portion of the film is applied with an electric field larger than that of the intrinsic insulation withstand voltage. That is, a voltage with which an electric field of from 3 MV/cm to 8 MV/cm is obtained is applied with respect to the gate insulating film having the desired film thickness. This voltage is equal to or less than the intrinsic insulation withstand voltage for the normal film thickness, and hence screening of defective portions including the A mode can be performed without damaging a normal insulating film portion.

In addition to the local thinning of the film, possible candidates for an initial defect and a potential defect include contamination of the gate insulating film, which can be screened by applying a voltage corresponding to the above-mentioned voltage for obtaining an electric field of from 3 MV/cm to 8 MV/cm because the quality of the insulating film is abnormal even though the thickness thereof is normal.

Figure 3:
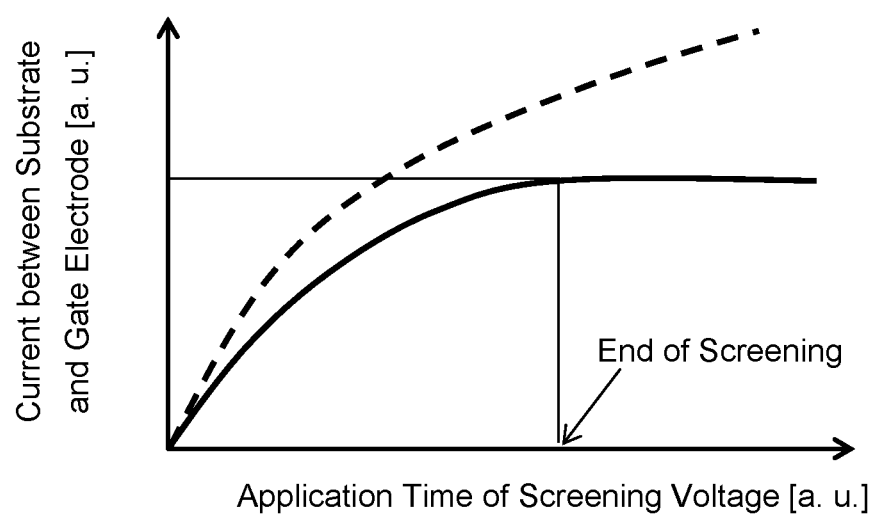
FIG. 3 is a graph of a current-voltage characteristic during screening in the first and second embodiments of the present invention.

FIG. 3 is a graph of a current-voltage characteristic during the screening in the first and second embodiments of the present invention.

With regard to screening time, as described above, when a target portion of screening is applied with a voltage equal to or larger than the intrinsic insulation withstand voltage with respect to the film thickness thereof, the target portion of screening is basically damaged immediately, and hence the voltage is not required to be applied for a long period of time. However, it is considered that, when a specific screening voltage is applied, time required by each of the target portions of screening until breakdown differs because film thicknesses and degrees of the deterioration of the film quality of the thin portion included in the target portions of screening are different within the semiconductor substrate. For that reason, the voltage may be applied for, for example, from about 0.5 msec to about 20 sec.

As breakdown of portions of potential defects proceeds due to the screening, portions having no insulating property increase. Accordingly, for example, when current between the voltage application terminal of the semiconductor substrate and the voltage application terminal of the gate electrode film with respect to the application time is monitored, the current value saturates at the point of time when only normal portions which can withstand the applied voltage remain after current increases until a certain point of the application time and the screening of defective portions is completed as shown by the solid line of the graph of FIG. 3. That is, it is possible to determine, by monitoring the current, the point of time when the current value saturates as the point of time of completion of the screening.

Referring back to FIG. 1, the process flow is described again. As described above, when the current value saturates within a predetermined application time, it is determined that the wafer is a non-defective wafer in the subsequent determination step (Step F). Further, when the current keeps increasing with respect to the application time without saturation as indicated by the dotted line of the graph of FIG. 3 and breakdown keeps occurring continuously even though an optimum screening voltage is applied, it can be determined that a lot of defects and abnormalities of the quality of the insulating film are caused in the entire substrate of the semiconductor device. When the semiconductor substrate in the middle of the manufacturing steps is determined as a defective wafer and the wafer is disposed of at the time point (Step G), outflow of defective products can be prevented as a matter of course, and a failure cost can be decreased because the wafer that is disposed of is not a finished product. Further, an abnormality in the manufacturing steps can be detected earlier, and hence it is possible to perform an investigation of the abnormality, take measures to prevent the outflow, and perform improvement actions more quickly.

Specifically, in the determination step (Step F) after the screening, each wafer is determined as defective (NG) or non-defective (OK) based on whether or not current between the voltage application terminal of the semiconductor substrate and the voltage application terminal of the gate electrode film saturates, and a defective wafer is disposed of (Step G). When the number of wafers that are disposed of in one lot is large, for example, the ratio of the defective wafers in one lot is 20% or more, not just the defective wafers but a whole lot that is processed at the same time or a whole batch that is processed at the same time may be disposed of. For example, when 25 wafers that are stored in a cassette are included in one lot and 150 wafers (that correspond to 6 lots) are processed in an oxidation/diffusion furnace at the same time, those 150 wafers are included in one batch. When it is considered that the whole batch that is processed at the same time is affected by an abnormality, the whole batch is disposed of.

Further, when the number of wafers that are disposed of is large, it is considered that there are causes other than the COP defect of the wafers, that is, causes in the steps themselves in which the wafers are processed. It is therefore required to check a contamination state of individual steps before the screening such as the gate insulating film forming step and the gate electrode film forming step and remove the cause of the contamination. As methods of investigating contamination in the steps, a CV measurement, a lifetime measurement, or a particle check is generally performed.

As soon as the contamination state is checked, the cause of the contamination is removed from the step in which the cause has been present, and the subsequent lots that have passed through the step in which the cause has been present are stopped to be subjected to disposition, for example, disposal or rework. In the above description, there is described an example in which a lot (batch) is disposed of when the ratio of the defective wafers in one lot is 20% or more, but the ratio is determined based on each product or each step as appropriate. However, when the ratio of the defective wafers in one lot is at least 50% or more, the lot (batch) should be disposed of and the contamination state of the individual steps should be checked. Further, it may be determined whether or not the lot (batch) should be disposed of depending on the checked contamination state and the specified cause of the contamination even when the ratio of the defective wafers is a set predetermined value or less.

In the above description, there is described an example in which wafers are disposed of when the wafers are determined as defective (NG) in the determination step. However, when it is possible, the gate electrode film and the gate insulating film on the front surface of the semiconductor substrate may be peeled to reproduce. Specifically, the gate insulating film and the gate electrode film are formed again after peeling, and then are subjected to the screening. There are only limited devices to which such a method can be applied, but in this way, it is possible to decrease the ratio of wafers that are disposed of. Also when this method is applied, as a matter of course, the cause of the contamination is specified and removed, and the subsequent lots are dealt with.

In the first embodiment, defects in the gate insulating film on the entire surface of the semiconductor substrate are the target of screening, and hence there is a possibility that a current supply amount due to breakdown of the defective portions through the screening is significantly large. For that reason, when the screening is performed, it is required to use a power supply apparatus that has a current supply capability with which the estimated current supply amount can be sufficiently covered, and to pay attention so that the applied voltage for the screening is not decreased due to the current supply.

As described above, through the screening of the gate insulating film in the first embodiment, defective portions that become potential defects including initial defects are damaged to lose the insulating property. As a result, the section between the semiconductor substrate and the gate electrode film enters a conductive state.

Next, the gate electrode film is patterned by a known technology to form a desired gate electrode (Step H).

Subsequently, a source and a drain, which are included in necessary elements, for example, the MIS transistor and the MIS capacitor element, an interlayer film, wirings, and a protective film, for example, are formed by a known technology to finish the semiconductor device (Step I).

After that, the finished semiconductor device is subjected to an electrical characteristic test. The portions that become potential defects including initial defects are caused to appear under a state in which the semiconductor substrate and the gate electrode are short-circuited, and can thus be initially detected through an operation failure, an abnormal stand-by current, or an abnormal operation current, and be removed without being particularly screened. When the semiconductor device passes the electrical characteristic test, the semiconductor device is finished in the wafer process (Step J).

In the first embodiment described above, description is made of the manufacturing steps in which only one type of gate insulating film is formed. However, in actual semiconductor integrated circuits, there are many cases in which a device is formed to have a plurality of types of gate insulating films, for example, gate insulating films having different film thicknesses and film compositions. Now, description is made of a second embodiment of the present invention which supports such a case.

Figure 5:
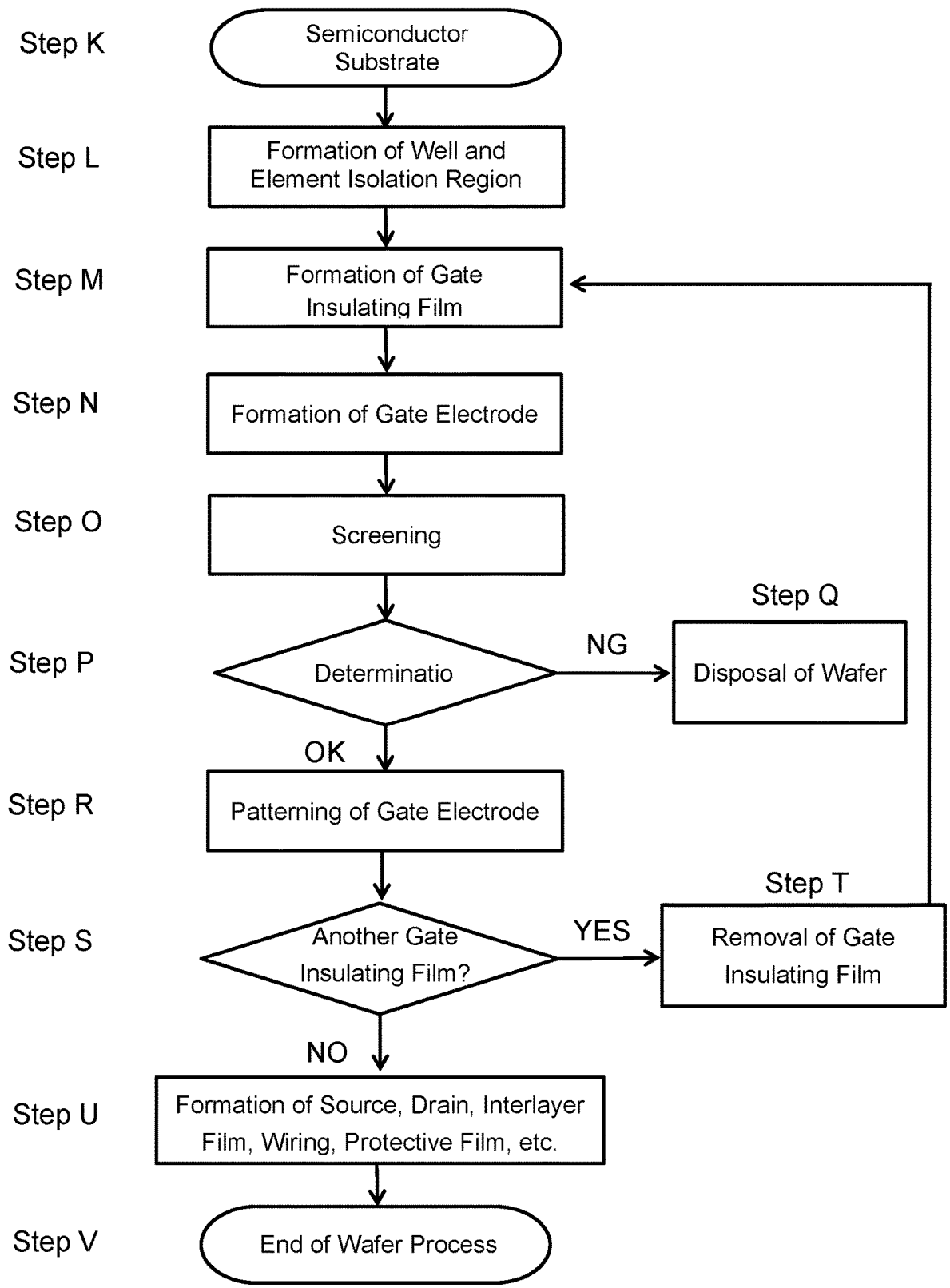
FIG. 5 is a process flow chart for illustrating a method of manufacturing a semiconductor device according to the second embodiment of the present invention.

FIG. 5 is a flow chart for illustrating a method of manufacturing a semiconductor device according to the second embodiment of the present invention. Prior to forming on a semiconductor substrate an MIS transistor and an MIS capacitor element that are elements of the semiconductor device, a required structure of the semiconductor device is formed by a known technology before formation of a gate insulating film that is included in the MIS transistor and the MIS capacitor element.

Step K and Step L are the same as Step A and Step B of FIG. 1 in the first embodiment described above, and hence description thereof is omitted.

Next, a first gate insulating film 3 included in the MIS transistor and the MIS capacitor element is formed on the entire surface of the semiconductor substrate 1 by a known technology. The first gate insulating film may be, regardless of a single-layer film or a multi-layer film, any film, for example, a silicon oxide film formed through thermal oxidation or deposition, a silicon nitride film, a silicon oxynitride film, or other films having an insulating property, as long as the film functions as the first gate insulating film. Its film thickness is also not required to be limited as long as the thickness satisfies the specification of the MIS transistor and the MIS capacitor element. Further, at this time, cleaning before the formation of the first gate insulating film is performed as necessary, for example (Step M).

In this first gate insulating film forming step, when, for example, a crystal originated particle (COP) defect or a foreign matter is present on the front surface of the semiconductor substrate, which serves as a base layer, the formation of the first gate insulating film is hindered at the place of the COP defect or the adhesion of the foreign matter, and thus a film that is locally thinner than the desired thickness of the first gate insulating film and causes a potential defect is formed.

Next, on the first gate insulating film 3, a first gate electrode film 4 is formed on the entire surface of the semiconductor substrate by a known technology. The first gate electrode film may be, regardless of a single-layer film or a multi-layer film, any film, for example, a film made of polycrystalline silicon containing impurities, a film obtained by forming a high-melting-point metal film on the film made of polycrystalline silicon, or other metal films, as long as the film functions as the first gate electrode film. Its film thickness is also not required to be limited as long as the thickness satisfies the desired specification of the semiconductor device (Step N).

In this first gate electrode film forming step, when, for example, a foreign matter is present on a surface of the first gate insulating film, which serves as a base layer, or in the vicinity of an interface between the first gate insulating film and the first gate electrode film, deterioration of the quality of the first gate insulating film that causes a potential defect is caused by contamination from the foreign matter. Further, local thinning of the first gate insulating film may occur due to physical stress applied from the foreign matter to the first gate insulating film in the manufacturing steps from the formation of the first gate electrode film and the subsequent steps.

Subsequently, screening of the first gate insulating film 3 is performed before patterning of the first gate electrode film 4. The screening is performed by using as electrodes the back surface of the semiconductor substrate of the wafer and the first gate electrode film formed on the entire front surface of the semiconductor substrate, and applying voltage to the first gate insulating film sandwiched by both the electrodes. At this time, it is desired that the first gate electrode film at an end portion of the front surface of the wafer have been removed or an insulating film equivalent to the element isolation regions have been formed from the front surface to the side surface and the back surface of the wafer end portion so that the first gate electrode film formed on the entire front surface of the wafer being the semiconductor substrate is not short-circuited with the semiconductor substrate by, for example, extending to the back surface at the wafer end portion (Step O).

Figure 4B:
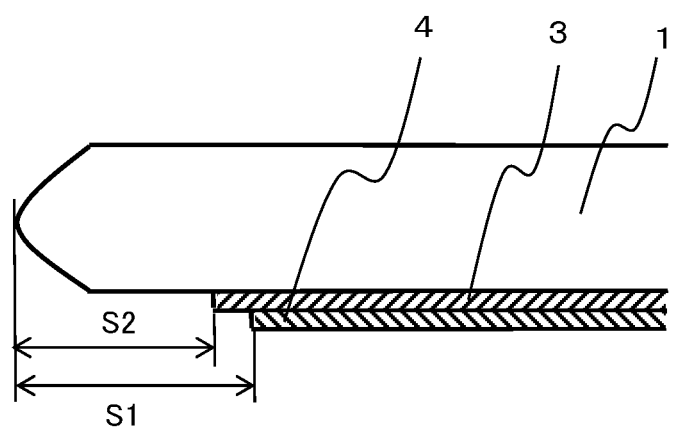

To the removal of the first gate electrode film at the wafer end portion in the second embodiment of the present invention, the description made in the first embodiment with reference to FIG. 4A and FIG. 4B can be applied as it is.

Further, to a method of obtaining a voltage application terminal to the semiconductor substrate 1 during the screening of the first gate insulating film in the second embodiment of the present invention, the description made in the first embodiment with reference to FIG. 2 can be applied as it is. To determination in the screening, the description made with reference to FIG. 3 can be applied as it is.

Referring back to FIG. 5, the process flow is described again. As described above with reference to FIG. 3, when the current value saturates within a predetermined application time, it is determined that the wafer is a non-defective wafer in the subsequent determination step (Step P). Further, when the current keeps increasing with respect to the application time without saturation as indicated by the dotted line of the graph of FIG. 3 and breakdown keeps occurring continuously even though an optimum screening voltage is applied, it can be determined that a lot of defects and abnormalities of the quality of the insulating film are caused in the entire substrate of the semiconductor device. When the semiconductor substrate in the middle of the manufacturing steps is determined as a defective wafer and the wafer is disposed of at the time point (Step Q), outflow of defective products can be prevented as a matter of course, and a failure cost can be decreased because the wafer that is disposed of is not a finished product. Further, an abnormality in the manufacturing steps can be detected earlier, and hence it is possible to perform an investigation of the abnormality, take measures to prevent the outflow, and perform improvement actions more quickly.

Specifically, in the determination step (Step P) after the screening, each wafer is determined as defective (NG) or non-defective (OK) based on whether or not current between the voltage application terminal of the semiconductor substrate and the voltage application terminal of the first gate electrode film saturates, and a defective wafer is disposed of (Step Q). When the number of wafers that are disposed of in one lot is large, for example, the ratio of the defective wafers in one lot is 20% or more, not just the defective wafers but a whole lot that is processed at the same time or a whole batch that is processed at the same time may be disposed of. For example, when 25 wafers that are stored in a cassette are included in one lot and 150 wafers (that correspond to 6 lots) are processed in an oxidation/diffusion furnace at the same time, those 150 wafers are included in one batch. When it is considered that the whole batch that is processed at the same time is affected by an abnormality, the whole batch is disposed of.

Further, when the number of wafers that are disposed of is large, it is considered that there are causes other than the COP defect of the wafers, that is, causes in the steps themselves in which the wafers are processed. It is therefore required to check a contamination state of individual steps before the screening such as the first gate insulating film forming step and the first gate electrode film forming step and remove the cause of the contamination. As methods of investigating contamination in the steps, the CV measurement, the lifetime measurement, or the particle check is generally performed.

As soon as the contamination state is checked, the cause of the contamination is removed from the step in which the cause has been present, and the subsequent lots that have passed through the step in which the cause has been present are stopped to be subjected to disposition, for example, disposal or rework. In the above description, there is described an example in which a lot (batch) is disposed of when the ratio of the defective wafers in one lot is 20% or more, but the ratio is determined based on each product or each step as appropriate. However, when the ratio of the defective wafers in one lot is at least 50% or more, the lot (batch) should be disposed of and the contamination state of the individual steps should be checked. Further, it may be determined whether or not the lot (batch) should be disposed of depending on the checked contamination state and the specified cause of the contamination even when the ratio of the defective wafers is a set predetermined value or less.

In the above description, there is described an example in which wafers are disposed of when the wafers are determined as defective (NG) in the determination step (Step P). However, when it is possible, the first gate electrode film and the first gate insulating film on the front surface of the semiconductor substrate may be peeled to reproduce. Specifically, the first gate insulating film and the first gate electrode film are formed again after peeling, and then are subjected to the screening. There are only limited devices to which such a method can be applied, but in this way, it is possible to decrease the ratio of wafers that are disposed of. Also when this method is applied, as a matter of course, the cause of the contamination is specified and removed, and the subsequent lots are dealt with.

In the second embodiment, defects in the gate insulating film on the entire surface of the semiconductor substrate are the target of screening, and hence there is a possibility that a current supply amount due to breakdown of the defective portions through the screening is significantly large. For that reason, when the screening is performed, it is required to use a power supply apparatus that has a current supply capability with which the estimated current supply amount can be sufficiently covered, and to pay attention so that the applied voltage for the screening is not decreased due to the current supply.

As described above, through the screening of the first gate insulating film in the second embodiment, defective portions that become potential defects including initial defects are damaged to lose the insulating property. As a result, the section between the semiconductor substrate and the first gate electrode film enters a conductive state.

Figure 6:
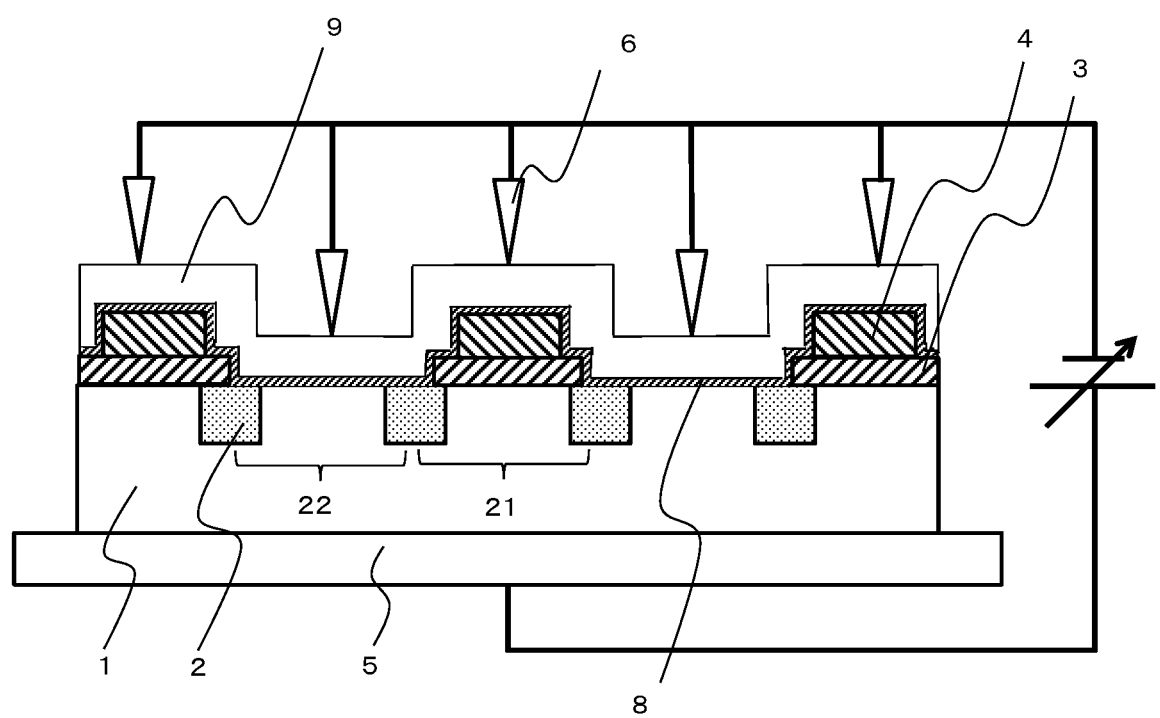
FIG. 6 is a sectional view for illustrating the method of manufacturing a semiconductor device according to the second embodiment of the present invention.

Next, the first gate electrode film 4 is patterned by a known technology to form a desired first gate electrode (Step R). In this step, a first element region 21 including the first gate insulating film 3 and the first gate electrode film 4, which is illustrated in FIG. 6, is formed.

Subsequently, in FIG. 5, there is illustrated a step (Step S) of determining whether a gate insulating film of another type should be formed. In the second embodiment, there is disclosed an application to a case in which elements having gate insulating films of different film thicknesses and film compositions are formed on the same wafer, and hence determination of "YES" is made in Step S. At least the first gate insulating film 3 that is formed in the previous step and remains is removed from the regions on which the desired gate insulating film of the other type should be formed (Step T).

When the first gate insulating film 3 is removed, at least a region in which the first gate insulating film 3 should remain is covered with the patterned first gate electrode film 4. The first gate electrode film 4 is therefore left so as not to cause any problem in electrical operation and quality so that it is possible to process the entire surface of the semiconductor substrate under a condition of known dry etching or wet etching for sufficiently removing the first gate insulating film 3. Alternatively, in order to prevent a plasma damage caused by dry etching to or corrosion caused by wet etching of the first gate insulating film 3 at an end portion of the patterned first gate electrode 4, it is possible to selectively remove the first gate insulating film 3 from the front surface of the semiconductor substrate under a state in which only a region in which the desired gate insulating film of the other type should be formed is selectively opened by patterning a photoresist by a known technology or a state in which a region in which the gate insulating film of the other type is not required to be formed is protected.

Next, as illustrated in FIG. 5, a second gate insulating film 8, which is included in the MIS transistor and the MIS capacitor element and has a different film thickness and film composition, is formed on the entire surface of the semiconductor substrate 1 by a known technology. The second gate insulating film may be, regardless of a single-layer film or a multi-layer film, any film, for example, a silicon oxide film formed through thermal oxidation or deposition, a silicon nitride film, a silicon oxynitride film, or other films having an insulating property, as long as the film functions as the second gate insulating film. Its film thickness is also not required to be limited as long as the thickness satisfies the specification of the MIS transistor and the MIS capacitor element. Further, at this time, cleaning before the formation of the second gate insulating film is performed as necessary, for example (Step M).

Through formation of the second gate insulating film 8 in Step M, the second gate insulating film 8 is formed also on the surface of the patterned first gate electrode film 4.

Also in this step of forming the second gate insulating film 8, when, for example, a crystal originated particle (COP) defect or a foreign matter is present on the front surface of the semiconductor substrate, which serves as a base layer, the formation of the second gate insulating film is hindered at the place of the COP defect or the adhesion of the foreign matter, and thus a film that is locally thinner than the desired thickness of the second gate insulating film and causes a potential defect is formed.

Next, on the second gate insulating film 8, a second gate electrode film 9 is formed on the entire surface of the semiconductor substrate by a known technology. The second gate electrode film may be, regardless of a single-layer film or a multi-layer film, any film, for example, a film made of polycrystalline silicon containing impurities, a film obtained by forming a high-melting-point metal film on the film made of polycrystalline silicon, or other metal films, as long as the film functions as the second gate electrode film. Its film thickness is also not required to be limited as long as the thickness satisfies the desired specification of the semiconductor device (Step N).

The patterned first gate electrode film 4 and the second gate electrode film 9 are in an insulated state by the second gate insulating film 8. In this second gate electrode film forming step, when, for example, a foreign matter is present on a surface of the second gate insulating film, which serves as a base layer, or in the vicinity of an interface between the second gate insulating film and the second gate electrode film, deterioration of the quality of the gate insulating film that causes a potential defect is caused by contamination from the foreign matter. Further, local thinning of the second gate insulating film may occur due to physical stress applied from the foreign matter to the second gate insulating film in the manufacturing steps from the formation of the gate electrode film and the subsequent steps.

Subsequently, screening of the second gate insulating film 8 is performed before patterning of the second gate electrode film 9. The screening is performed by using as electrodes the back surface of the semiconductor substrate of the wafer and the second gate electrode film formed on the entire front surface of the semiconductor substrate, and applying voltage to the second gate insulating film sandwiched by both the electrodes. At this time, it is desired that the second gate electrode film at an end portion of the front surface of the wafer have been removed or an insulating film equivalent to the element isolation regions have been formed from the front surface to the side surface and the back surface of the wafer end portion so that the second gate electrode film formed on the entire front surface of the wafer being the semiconductor substrate is not short-circuited with the semiconductor substrate by, for example, extending to the back surface at the wafer end portion (Step O).

To the removal of the second gate electrode film at the wafer end portion in the second embodiment of the present invention, the description made in the first embodiment with reference to FIG. 4A and FIG. 4B can be applied as it is.

Further, with reference to FIG. 6, description is given of a method of obtaining a voltage application terminal to the semiconductor substrate 1 during the screening in the second embodiment of the present invention. The back surface of the semiconductor substrate 1 is fixed to the metal chuck 5 which serves as one voltage application terminal. Then, also from a front surface of the semiconductor device, the probe 6, namely, a metal terminal having a needle shape which is connected to the semiconductor device is brought into contact with the second gate electrode film 9. The probe 6 can thus be used as the voltage application terminal. Voltage is applied to the second gate insulating film 8 to perform screening.

At this time, in order to eliminate parasitic resistance causing decrease in applied voltage as much as possible, it is desired that insulating materials and high-resistance conductive materials that adhere to or are formed on the back surface of the semiconductor substrate 1 which is brought into contact with the metal chuck 5 of the prober is removed in advance. Further, voltage application is possible when there is at least one probe 6 that is grounded on the second gate electrode film 9, but in order to eliminate the effect of the parasitic resistance, it is desired that a plurality of probes that are uniformly grounded on the second gate electrode film 9 formed on the entire front surface of the semiconductor substrate 1 be provided at a density of, for example, from 0.1 probes/cm$^2$ to 20 probes/cm$^2$.

Further, there is a possibility of damaging the second gate electrode film 9 because the probe is directly grounded on the surface of the second gate electrode film 9. However, as described later, a second gate electrode is formed by patterning the second gate electrode film after the screening, and hence, when the position of the probe is set in advance to portions of the second gate electrode film 9 that are removed by the patterning, the effect of the damage on the finished product of the semiconductor device can be prevented.

With regard to the polarity of the applied voltage, for example, in a case of the above-mentioned N-channel-type MIS transistor and an MIS capacitor element including a P-type lower electrode, screening effect can be obtained also when the P-type semiconductor substrate is applied with a ground voltage, and the second gate electrode film is applied with a positive voltage with respect to the ground voltage. However, the front surface of the semiconductor substrate right below the second gate electrode film becomes the depletion side, and when the concentration of the front surface of the semiconductor substrate is low, a depletion layer is liable to generate, and thus screening efficiency is lowered. When the P-type semiconductor substrate is applied with the ground voltage and the second gate electrode film is applied with a negative voltage with respect to the ground voltage, the front surface of the semiconductor substrate right below the second gate electrode film becomes the accumulation side. As a result, voltage can be more effectively applied to the second gate insulating film, which is preferred.

In the second embodiment, description is given of a case in which the polarity of the second gate electrode film 9 is specified while the semiconductor substrate 1 is applied with the ground voltage. However, as the essence of the present invention, it is only required to maintain the relationship of the potential between the semiconductor substrate 1 and the second gate electrode film 9. The same effect can be obtained even when the applied voltages are replaced, that is, when the second gate electrode film 9 is applied with the ground voltage and the semiconductor substrate 1 is applied with a positive or negative voltage with respect to the ground voltage.

Breakdown modes of the gate insulating film include: the A mode, in which the gate insulating film is damaged at a low electric field of from 0 MV/cm to 3 MV/cm with respect to the thickness of the gate insulating film to become an initial defect; the B mode, in which the gate insulating film is damaged at a medium electric field of from 3 MV/cm to 8 MV/cm with respect to the thickness of the gate insulating film, and may become a potential defect; and the C mode, in which the gate insulating film is damaged at a high electric field of 8 MV/cm or more with respect to the thickness of the gate insulating film due to an intrinsic insulation withstand voltage limit of the insulating film. The gate insulating film loses its insulating property due to the breakdown, and does not perform its function anymore.

The above-mentioned local thinning of the gate insulating film that may cause a potential defect has a film thickness of from 0% to 80% of the desired film thickness at, for example, the place of the COP defect or the vicinity of the foreign matter, and hence a breakdown electric field of the thin portion of the film reaches the intrinsic insulation withstand voltage limit while the breakdown electric field is of from 0% to 80% of that of a portion having a normal film thickness. As a result, the breakdown mode of the gate insulating film including such a defect is the A mode or the B mode.

Consequently, in order to screen portions of potential defects, it is only required to apply a voltage with which the thin portion of the film is applied with an electric field larger than that of the intrinsic insulation withstand voltage. That is, a voltage with which an electric field of from 3 MV/cm to 8 MV/cm is obtained is applied with respect to the gate insulating film having the desired film thickness. This voltage is equal to or less than the intrinsic insulation withstand voltage for the normal film thickness, and hence screening of defective portions including the A mode can be performed without damaging a normal insulating film portion.

In addition to the local thinning of the film, possible candidate for an initial defect and a potential defect include contamination of the gate insulating film, which can be screened by applying a voltage corresponding to the above-mentioned voltage for obtaining an electric field of from 3 MV/cm to 8 MV/cm because the quality of the insulating film is abnormal even though the thickness thereof is normal.

Now, description is given of an influence on the first gate insulating film 4 at the time of the screening of the second gate insulating film. In the vicinity of the front surface of the semiconductor substrate 1, the element isolation region 2 is formed. The screened first gate insulating film 3 on the front surfaces of the semiconductor substrate 1 and the element isolation region 2 is covered with the patterned first gate electrode film 4. Further, the first gate electrode film is covered with the second gate electrode film 9 under an insulated state via the second gate insulating film 8. Meanwhile, the surface of the second gate insulating film 8 which is formed on the front surfaces of the semiconductor substrate 1 and the element isolation region 2 and is not screened yet is covered with the second gate electrode film 9 directly. Accordingly, to the second gate insulating film 8, which is not screened yet, a voltage applied between the semiconductor substrate 1 and the second gate electrode film 9 is directly applied, but to the first gate insulating film 3, only a voltage that is smaller as compared to the voltage of the screening condition is applied because a voltage applied to the second gate electrode film 9 is capacitively divided by the second gate insulating film to be applied to the first gate electrode film 4. As a result, it is possible to suppress occurrence of a wear-out failure due to excessive voltage stress with respect to the screened gate insulating film.

Further, when a capacitor element that includes the first gate electrode film 4 and the second gate electrode film 9 as a lower layer and an upper layer, respectively, and the second gate insulating film as a capacitive insulation film is positively utilized in the semiconductor device, voltage is applied between the first and second gate electrode films through the screening in this step even though the voltage is decreased to some extent. The screening in this step can therefore also serve as screening of an initial defect of the capacitor element.

Further, to the determination of the screening in the second embodiment of the present invention, the description made with reference to FIG. 3 can be applied as it is.

Referring back to FIG. 5, the process flow is described again. As in the above-mentioned description with reference to FIG. 3, when the current value saturates within a predetermined application time, it is determined that the wafer is a non-defective wafer in the subsequent determination step (Step P). Further, when the current keeps increasing with respect to the application time without saturation as indicated by the dotted line of the graph of FIG. 3 and breakdown keeps occurring continuously even though an optimum screening voltage is applied, it can be determined that a lot of defects and abnormalities of the quality of the insulating film are caused in the entire substrate of the semiconductor device. When the semiconductor substrate in the middle of the manufacturing steps is determined as a defective wafer and the wafer is disposed of at the time point (Step Q), outflow of defective products can be prevented as a matter of course, and a failure cost can be decreased because the wafer that is disposed of is not a finished product. Further, an abnormality in the manufacturing steps can be detected earlier, and hence it is possible to perform an investigation of the abnormality, take measures to prevent the outflow, and perform improvement actions more quickly.

Next, the second gate electrode film 9 is patterned by a known technology to form a desired second gate electrode (Step R). In this step, in addition to the first element region 21 including the first gate insulating film 3 and the first gate electrode film 4, which is illustrated in FIG. 6, a second element region 22 including the second gate insulating film 8 and the second gate electrode film 9 is formed.

Subsequently, in FIG. 5, when a third, a fourth, and an n-th gate insulating film of other types are provided, the processing of Step M to Step T can be repeatedly performed a required number of times in accordance with the determination of "YES" in Step S. To the method of manufacturing the semiconductor device in the step of repeating Step M to Step T, the above-mentioned description can be applied for each step. Although not shown, when the third, the fourth, and the n-th gate insulating film of the other types are provided, in accordance with that, a third element region, a fourth element region, and an n-th element region are formed in the same semiconductor substrate.

As described above with regard to the screening of the second gate insulating film, the gate insulating film that has already been formed and screened is applied with a voltage that is lower than a voltage applied to the metal chuck 5 and the probe 6 when the subsequent screening is performed. In order to more effectively suppress the excessive voltage stress with respect to the screened gate insulating film, it is preferred that, in the method of manufacturing the semiconductor device of the present invention, the first to n-th gate insulating films be formed in an order of from the one having a large film thickness to the one having a small film thickness, or in an order of from the one requiring a high screening voltage to the one requiring a low screening voltage.

Finally, after the processing of Step M to Step T is repeatedly performed a required number of times, a source and a drain, which are included in the necessary elements, for example, the MIS transistor and the MIS capacitor element, an interlayer film, wirings, and a protective film, for example, are formed by a known technology to finish the semiconductor device (Step U).

After that, the finished semiconductor device is subjected to the electrical characteristic test. The portions that become potential defects including initial defects are caused to appear under a state in which the semiconductor substrate and the gate electrode are short-circuited, and can thus be initially detected through an operation failure, an abnormal stand-by current, or an abnormal operation current, and be removed without being particularly screened. When the semiconductor device passes the electrical characteristic test, the semiconductor device is finished in the wafer process (Step V).

With regard to the polarity of the applied voltage in the screening in the second embodiment, the N-channel-type MIS transistor in the P-type semiconductor substrate is taken as a main example in the second embodiment. However, in a lot of cases of actual semiconductor devices, a P-channel-type MIS transistor is also included to introduce an N-type diffusion layer under the gate insulating film of the P-channel-type MIS transistor, thereby coexisting with the P-type diffusion layer under the gate insulating film of the N-channel-type MIS transistor. For example, when N-channel-type and P-channel-type MIS transistors are mixedly provided in the P-type semiconductor substrate, a well formed of an N-type diffusion layer in the P-type semiconductor substrate is formed to serve as a substrate of the P-channel-type MIS transistor. When the P-type semiconductor substrate is applied with the ground voltage, and the gate electrode film is applied with a positive voltage with respect to the ground voltage under this state, the potential of the N-type well is increased due to an increase of a diffusion potential between the P-type semiconductor substrate and the N-type well layer, and thus the desired screening voltage cannot be applied to the gate insulating film between the gate electrode film and the N-type well. In view of this, when the P-type semiconductor substrate is applied with the ground voltage, and the gate electrode film is applied with a negative voltage with respect to the ground voltage, a potential difference between the P-type semiconductor substrate and the N-type well is suppressed to be about 0.5 V due to a forward voltage drop. Consequently, a sufficient screening voltage can be applied to the gate electrode film and the gate insulating film of the N-type well.

Similarly, when P-channel-type and N-channel-type MIS transistors are provided in the N-type semiconductor substrate, a P-type well diffusion layer is formed in the N-type semiconductor substrate to serve as a substrate of the N-channel-type MIS transistor. When the semiconductor substrate is applied with the ground voltage, and the gate electrode film is applied with a positive voltage with respect to the ground voltage, a potential difference between the N-type semiconductor substrate and the P-type well is suppressed to be about 0.5 V due to a forward voltage drop. Consequently, a sufficient screening voltage can be applied to the gate electrode film and the gate insulating film of the P-type well.

With regard to the MIS capacitor element, similarly, when an MIS capacitor element including an N-type diffusion layer as the lower electrode is provided in the P-type semiconductor substrate, it is only required that the semiconductor substrate be applied with the ground voltage, and the gate electrode film be applied with a negative voltage with respect to the ground voltage. When an MIS capacitor element including a P-type diffusion layer as the lower electrode is provided in the N-type semiconductor substrate, it is only required that the semiconductor substrate be applied with the ground voltage, and the gate electrode film be applied with a positive voltage with respect to the ground voltage. In the second embodiment, description is given of a case in which the polarity of the gate electrode film is specified while the semiconductor substrate is applied with the ground voltage. However, as the essence of the present invention, it is only required to maintain the relationship of the potential between the semiconductor substrate and the gate electrode film. The same effect can be obtained even when the applied voltages are replaced, that is, when the gate electrode film is applied with the ground voltage and the semiconductor substrate is applied with a positive or negative voltage with respect to the ground voltage.

The core of the present invention resides in that screening is performed in a structure including the gate insulating film on the semiconductor substrate and the gate electrode film on the gate insulating film and the entire surface of the semiconductor substrate. Consequently, it is apparent that the present invention is not limited to the manufacturing steps and the structures before, after, or in the middle of the screening as long as the above-mentioned structure is formed.

What is claimed is:

1. A method of manufacturing a semiconductor device, the semiconductor device having a gate insulating film and a gate electrode film on a semiconductor substrate of a wafer, the method comprising:

forming a first gate insulating film on the semiconductor substrate of the wafer;

forming a first gate electrode film on an entire surface of the semiconductor substrate of the wafer, the semiconductor substrate of the wafer including the first gate insulating film;

screening, after the forming a first gate electrode film, the first gate insulating film by generating a potential difference between the first gate electrode film which is formed on the entire surface of the semiconductor substrate of the wafer, and a back surface of the semiconductor substrate of the wafer to apply an electric field to the first gate insulating film;

determining the semiconductor substrate of the wafer which has been subjected to the screening;

patterning the first gate electrode film after the determining the semiconductor substrate;

removing, after the patterning the first gate electrode film, the first gate insulating film which is formed on the entire surface of the semiconductor substrate of the wafer from at least a region in which a second gate insulating film is to be formed;

forming, after removing the first gate insulating film, the second gate insulating film on the semiconductor substrate of the wafer;

forming a second gate electrode film on the entire surface of the semiconductor substrate of the wafer, the semiconductor substrate of the wafer including the second gate insulating film;

screening, after the forming a second gate electrode film, the second gate insulating film by generating a potential difference between the second gate electrode film which is formed on the entire surface of the semiconductor substrate of the wafer, and the back surface of the semiconductor substrate of the wafer to apply an electric field to the second gate insulating film;

determining the semiconductor substrate of the wafer which has been subjected to the screening; and patterning the second gate electrode film after the determining the semiconductor substrate.

2. The method of manufacturing a semiconductor device according to claim 1, further comprising repeating a plurality of times:

removing, after the patterning the second gate electrode film, a gate insulating film that is previously formed;

forming a new gate insulating film on the semiconductor substrate of the wafer;

forming a new gate electrode film on the entire surface of the semiconductor substrate of the wafer which includes the new gate insulating film;

screening, after the forming a new gate electrode film, the new gate insulating film by generating a potential difference between the new gate electrode film which is formed on the entire surface of the semiconductor substrate of the wafer, and the back surface of the semiconductor substrate of the wafer to apply an electric field to the new gate insulating film;

determining the semiconductor substrate of the wafer which has been subjected to the screening; and patterning the new gate electrode film after the determining the semiconductor substrate.

3. The method of manufacturing a semiconductor device according to claim 1, further comprising forming the gate insulating film a plurality of times so that the second gate insulating film has a thickness smaller than a thickness of the first gate insulating film or a gate insulating film that is formed later has a smaller thickness.

4. The method of manufacturing a semiconductor device according to claim 1, further comprising applying a screening voltage for the gate insulating film that is formed a plurality of times so that a screening voltage for the second gate insulating film is higher than a screening voltage for the first gate insulating film or a screening voltage for a gate insulating film that is formed later is higher.

* * * * *